(12) United States Patent
Sameshima et al.

(10) Patent No.: US 10,784,110 B2
(45) Date of Patent: Sep. 22, 2020

(54) TUNGSTEN FILM FORMING METHOD, FILM FORMING SYSTEM AND FILM FORMING APPARATUS

(71) Applicant: TOKYO ELECTRON LIMITED, Tokyo (JP)

(72) Inventors: Takashi Sameshima, Nirasaki (JP); Koji Maekawa, Nirasaki (JP); Katsumasa Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/250,009

(22) Filed: Jan. 17, 2019

(65) Prior Publication Data

US 2019/0221434 A1 Jul. 18, 2019

(30) Foreign Application Priority Data

Jan. 18, 2018 (JP) .................... 2018-006529

(51) Int. Cl.
| | |
|---|---|
| *H01L 21/285* | (2006.01) |
| *C23C 16/14* | (2006.01) |
| *C23C 16/34* | (2006.01) |
| *C23C 16/56* | (2006.01) |
| *C23C 16/44* | (2006.01) |
| *C23C 16/52* | (2006.01) |
| *C23C 16/02* | (2006.01) |
| *H01L 21/768* | (2006.01) |
| *H01L 21/28* | (2006.01) |

(52) U.S. Cl.
CPC .... *H01L 21/28568* (2013.01); *C23C 16/0272* (2013.01); *C23C 16/14* (2013.01); *C23C 16/34* (2013.01); *C23C 16/4408* (2013.01); *C23C 16/52* (2013.01); *C23C 16/56* (2013.01); *H01L 21/28556* (2013.01); *H01L 21/28088* (2013.01); *H01L 21/76843* (2013.01); *H01L 21/76876* (2013.01); *H01L 21/76895* (2013.01)

(58) Field of Classification Search
CPC ......... H01L 21/28568; H01L 21/28088; C23C 16/0272
See application file for complete search history.

(56) References Cited

U.S. PATENT DOCUMENTS

| | | | | |
|---|---|---|---|---|
| 6,433,433 B1 * | 8/2002 | Sengupta | .......... | H01L 21/76814 257/750 |
| 7,338,901 B2 * | 3/2008 | Ishizaka | ............ | C23C 16/45529 257/E21.161 |

(Continued)

FOREIGN PATENT DOCUMENTS

| | | |
|---|---|---|
| JP | 2013-213274 A | 10/2013 |
| KR | 10-1998-0060599 A | 10/1998 |

(Continued)

*Primary Examiner* — William Coleman
(74) *Attorney, Agent, or Firm* — Nath, Goldberg & Meyer; Jerald L. Meyer

(57) ABSTRACT

A tungsten film forming method in which a substrate having a TiN film formed thereon is disposed in a processing container and a tungsten film is formed above a surface of the substrate while heating the substrate in a reduced pressure atmosphere, includes forming a first film of an aluminum-containing material on the substrate and forming the tungsten film on the first film.

39 Claims, 10 Drawing Sheets

(56) References Cited

U.S. PATENT DOCUMENTS

| | | | | |
|---|---|---|---|---|
| 7,785,665 B2 * | 8/2010 | Gates, Jr. | ............ | C23C 16/0272 |
| | | | | 427/255.15 |
| 8,728,935 B2 * | 5/2014 | Harada | .................. | C23C 16/34 |
| | | | | 257/E21.295 |
| 9,853,123 B2 * | 12/2017 | Hung | ................ | H01L 29/66545 |
| 9,947,578 B2 * | 4/2018 | Lei | ...................... | C23C 16/4401 |
| 2009/0325372 A1 * | 12/2009 | Harada | .................. | C23C 16/34 |
| | | | | 438/591 |
| 2011/0059608 A1 * | 3/2011 | Gao | .................... | C23C 16/0272 |
| | | | | 438/654 |
| 2014/0327139 A1 * | 11/2014 | Yu | ...................... | H01L 23/5226 |
| | | | | 257/751 |

FOREIGN PATENT DOCUMENTS

| | | |
|---|---|---|
| KR | 10-0557964 B1 | 3/2006 |
| KR | 10-0688652 B1 | 3/2007 |

* cited by examiner

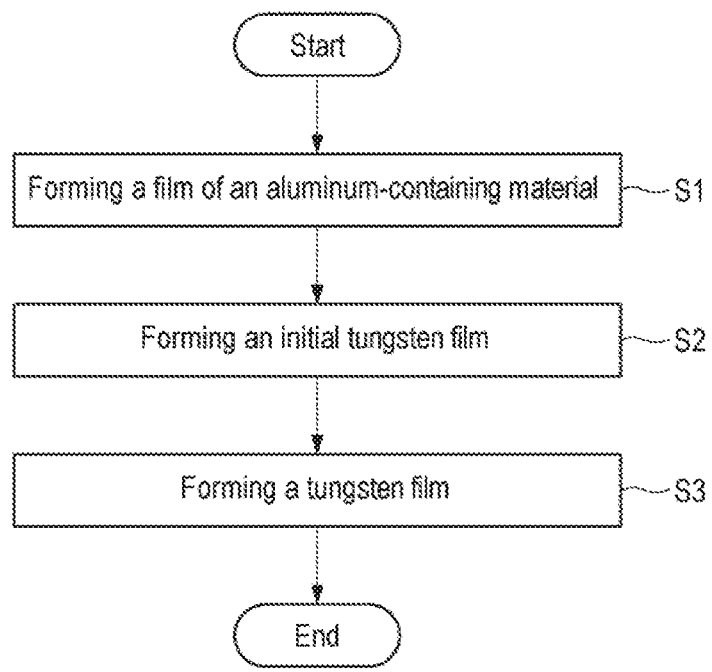

TUNGSTEN FILM FORMING METHOD, FILM FORMING SYSTEM AND FILM FORMING APPARATUS

CROSS-REFERENCE TO RELATED APPLICATION

This application is based upon and claims the benefit of priority from Japanese Patent Application No. 2018-006529, filed on Jan. 18, 2018, the entire contents of which are incorporated herein by reference.

TECHNICAL FIELD

Various aspects and embodiments of the present disclosure relate to a tungsten film forming method, a film forming system and a film forming apparatus.

BACKGROUND

When manufacturing LSI, tungsten is widely used for a MOSFET gate electrode, a contact with source/drain, a word line of a memory, and the like. In a multilayer wiring process, a copper wiring is mainly used. However, copper is poor in heat resistance and is easily diffused. For this reason, tungsten is used for parts requiring heat resistance, parts for which deterioration of electrical characteristics due to copper diffusion is a concern, and the like.

A physical vapor deposition (PVD) method was previously used for tungsten film formation processing. However, it is difficult for the PVD method to cope with a portion requiring high coverage (step coverage). For this reason, a chemical vapor deposition (CVD) method with good step coverage is used for tungsten film formation processing.

When forming a tungsten film by the CVD method, from the viewpoint of adhesion to a silicon layer and suppression of a reaction, there has been used a method in which a TiN film is formed as a barrier layer on a silicon layer and a tungsten film is formed thereon. In this method, a nucleation process for facilitating uniform tungsten film formation is performed prior to main film formation of the tungsten film by the above reaction.

However, the tungsten film produced by the nucleation process (hereinafter also referred to as "nucleation film") has a high resistance. Therefore, when thinning the entire tungsten film, the tungsten film has a high resistance due to the influence of the nucleation film portion.

In LSI, a wiring is miniaturized, and reduction in resistance of a wiring is required. For example, in a three-dimensional stacked semiconductor memory such as a 3D NAND flash memory or the like, a tungsten film is formed as a word line. For purposes of miniaturization, it is required to further reduce the resistance of the tungsten film.

SUMMARY

Some embodiments of the present disclosure provide a technique capable of reducing the resistance of a tungsten film even when the tungsten film is made thin.

According to one embodiment of the present disclosure, there is provided a tungsten film forming method in which a substrate having a TiN film formed thereon is disposed in a processing container and a tungsten film is formed above a surface of the substrate while heating the substrate in a reduced pressure atmosphere, including: forming a first film of an aluminum-containing material on the substrate; and forming the tungsten film on the first film.

According to another embodiment of the present disclosure, there is provided a film forming system, including: a first film forming apparatus including a first processing container, a first exhaust part, a first heating mechanism and a first gas supply mechanism including an aluminum-containing gas supply source; a second film forming apparatus including a second processing container, a second exhaust part, a second heating mechanism and a second gas supply mechanism including a tungsten gas supply source; and a control part, wherein the control part is configured to control the first exhaust part, the first heating mechanism, the first gas supply mechanism, the second exhaust part, the second heating mechanism and the second gas supply mechanism so as to perform: forming a first film of an aluminum-containing material on a surface of a substrate having a TiN film formed thereon in the first processing container while heating the substrate in a reduced pressure atmosphere; and forming a tungsten film on the first film in the second processing container while heating the substrate having the first film formed thereon in a reduced pressure atmosphere.

According to another embodiment of the present disclosure, there is provided a film forming apparatus, including: a processing container; an exhaust part; a heating mechanism; a gas supply mechanism including an aluminum-containing gas supply source and a tungsten-containing gas supply source; and a control part, wherein the control part is configured to control the exhaust part, the heating mechanism and the gas supply mechanism so as to perform: forming a first film of an aluminum-containing material on a surface of a substrate having a TiN film formed thereon in the processing container while heating the substrate in a reduced pressure atmosphere; and forming a tungsten film on the first film in the processing container while heating the substrate having the first film formed thereon in a reduced pressure atmosphere.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a flowchart showing a flow of respective steps of a film forming method according to an embodiment.

DETAILED DESCRIPTION

Figure 1:
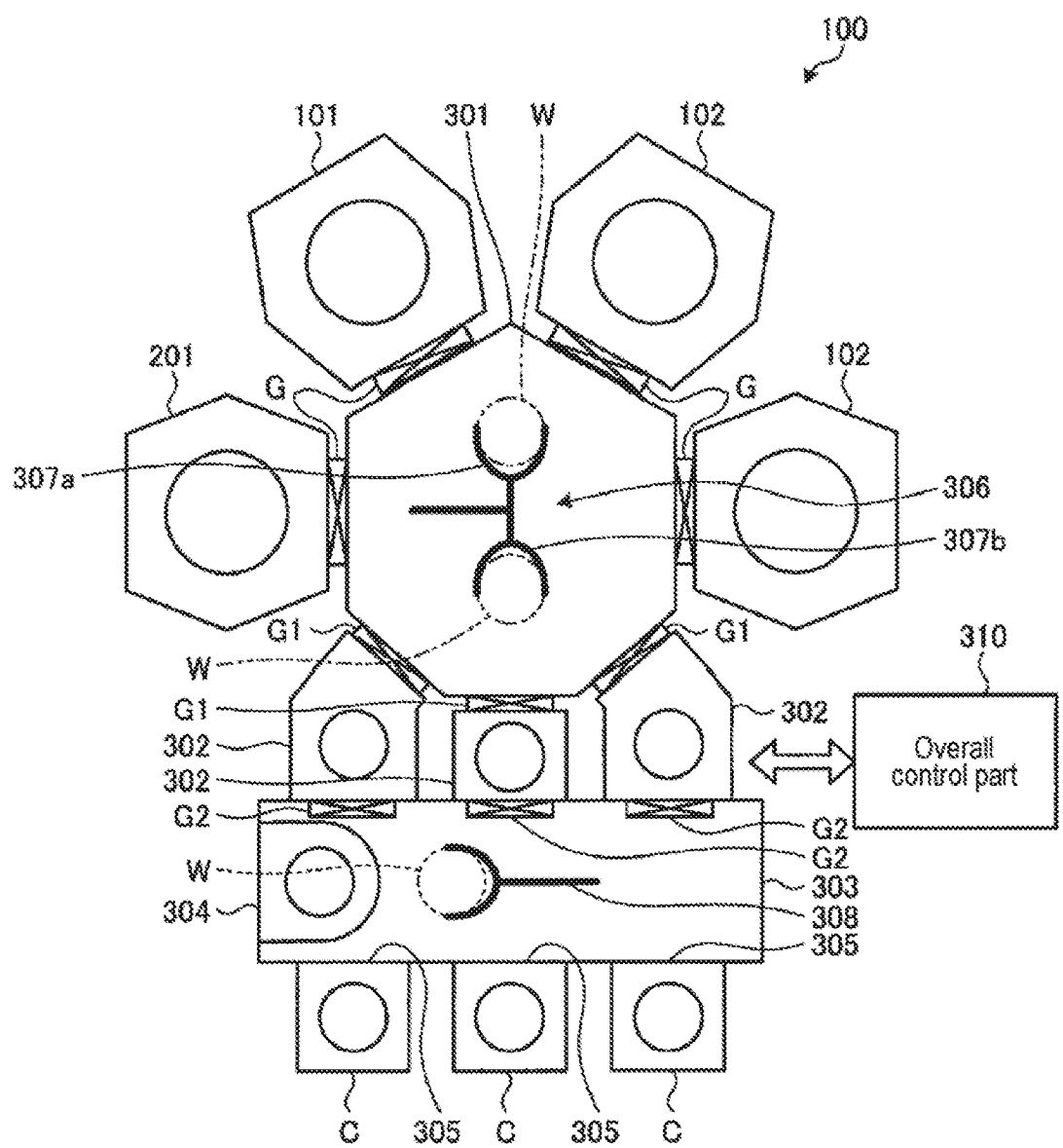
FIG. 1 is a diagram showing an example of a schematic overall configuration of a film forming system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a tungsten film forming method and a film forming system disclosed in the subject application will be described in detail with reference to the drawings. In the drawings, the same or corresponding parts are designated by like reference numerals. In addition, the technique disclosed herein is not limited by the embodiments.

[System Configuration]

In the present embodiment, a case where film formation is performed by a film forming system including a plurality of film forming apparatuses will be described as an example. First, a film forming system according to the present embodiment will be described. FIG. 1 is a diagram showing an example of a schematic overall configuration of a film forming system according to an embodiment. The film forming system 100 includes a first film forming apparatus 101 and a second film forming apparatus 102. In the film forming system 100 according to the embodiment, the first film forming apparatus 101 is used for forming an aluminum-containing material film and the second film forming apparatus 102 is used for forming a tungsten film. A transfer mechanism (not shown) is connected to the first film forming apparatus 101 and the second film forming apparatus 102, and a substrate as a film formation target is transferred by the transfer mechanism.

In the film forming system 100, a titanium nitride film (TiN) is formed as a base film, an aluminum-containing material film is formed on the titanium nitride film (TiN), and then a tungsten film is formed on the aluminum-containing material film.

As shown in FIG. 1, the film forming system 100 includes one base film forming apparatus 201 for forming a titanium nitride film (TiN), one first film forming apparatus 101 for forming an aluminum-containing material film, and two second film forming apparatuses 102 for forming a tungsten film. These apparatuses are connected to four wall portions of a vacuum transfer chamber 301 having a heptagonal shape in a plan view via gate valves G, respectively. The inside of the vacuum transfer chamber 301 is evacuated by a vacuum pump and kept at a predetermined degree of vacuum. In other words, the film forming system 100 is a multi-chamber type vacuum processing system, in which a tungsten film can be continuously formed without breaking the vacuum. That is, all of the processes performed in the processing containers of the base film forming apparatus 201, the first film forming apparatus 101, and the second film forming apparatuses 102 are performed without exposing a silicon wafer W (hereinafter referred to as "wafer W") to the air.

The configurations of the first film forming apparatus 101 and the second film forming apparatus 102 will be described later. The base film forming apparatus 201 is, for example, an apparatus for forming a titanium nitride film (TiN) by alternately supplying, for example, a titanium-containing gas and a nitrogen-containing gas onto the wafer W by ALD (Atomic Layer Deposition) in a vacuum atmosphere chamber.

Three load lock chambers 302 are connected to the remaining three wall portions of the vacuum transfer chamber 301 via gate valves G1. At the opposite side of the vacuum transfer chamber 301 across the load lock chambers 302, an atmospheric transfer chamber 303 is provided. The three load lock chambers 302 are connected to the atmospheric transfer chamber 303 via gate valves G2. The load lock chambers 302 control a pressure between the atmospheric pressure and the vacuum when the wafer W is transferred between the atmospheric transfer chamber 303 and the vacuum transfer chamber 301.

Three carrier attachment ports 305, to which carriers (FOUPs or the like) C for accommodating wafers W are attached, are provided on the wall portion of the atmospheric transfer chamber 303 opposite to the wall portion to which the load lock chambers 302 are attached. An alignment chamber 304 for aligning the wafer W is provided on the sidewall of the atmospheric transfer chamber 303. A downflow of clean air is formed in the atmospheric transfer chamber 303.

Inside the vacuum transfer chamber 301, a transfer mechanism 306 is provided. The transfer mechanism 306 transfers the wafer W to the base film forming apparatus 201, the first film forming apparatus 101, the second film forming apparatuses 102, and the load lock chambers 302. The transfer mechanism 306 has two independently-movable transfer arms 307a and 307b.

Inside the atmospheric transfer chamber 303, a transfer mechanism 308 is provided. The transfer mechanism 308 is configured to transfer the wafer W to the carriers C, the load lock chambers 302, and the alignment chamber 304.

The film forming system 100 includes an overall control part 310. The overall control part 310 includes a main control part having a CPU (computer) for controlling the respective constituent parts of the base film forming apparatus 201, the first film forming apparatus 101 and the second film forming apparatus 102, the exhaust mechanism, the gas supply mechanism and the transfer mechanism 306 of the vacuum transfer chamber 301, the exhaust mechanism and the gas supply mechanism of the load lock chamber 302, the transfer mechanism 308 of the atmospheric transfer chamber 303, the drive systems of the gate valves G, G1 and G2, and the like, an input device (a keyboard, a mouse, etc), an output device (a printer, etc.), a display device (a display, etc.), and a storage device (a storage medium). The main control part of the overall control part 310 causes the film forming system 100 to perform a predetermined operation, for example, based on a processing recipe stored in a storage medium built in the storage device or in a storage medium set in the storage device. The overall control part 310 may be a higher-level control part of the control parts of the respective units, such as the control part 6 of the first film forming apparatus 101 and the second film forming apparatus 102 which will be described later.

Next, the operation of the film forming system 100 configured as described above will be described. The following processing operation is executed based on the processing recipe stored in the storage medium in the overall control part 310.

First, the wafer W is taken out from the carrier C connected to the atmospheric transfer chamber 303 by the transfer mechanism 308. After passing through the alignment chamber 304, the wafer W is loaded into one of the lock chambers 302 by opening the gate valve G2 of one of the load lock chambers 302. After closing the gate valve G2, the inside of the load lock chamber 302 is evacuated.

When the load lock chamber 302 reaches a predetermined degree of vacuum, the gate valve G1 is opened to take out the wafer W from the load lock chamber 302 by one of the transfer arms 307a and 307b of the transfer mechanism 306.

Then, the gate valve G of the base film forming apparatus 201 is opened, the wafer W held by one of the transfer arms of the transfer mechanism 306 is loaded into the base film forming apparatus 201, and the empty transfer arm is returned to the vacuum transfer chamber 301. The gate valve G is closed, and a film forming process of a titanium nitride film (TiN) is performed by the base film forming apparatus 201.

After completion of the film forming process of the titanium nitride film (TiN), the gate valve G of the base film forming apparatus 201 is opened and the wafer W therein is unloaded by one of the transfer arms 307a and 307b of the transfer mechanism 306. Then, the gate valve G of the first film forming apparatus 101 is opened, the wafer W held by the transfer arm is loaded into the first film forming apparatus 101, and the empty transfer arm is returned to the vacuum transfer chamber 301. The valve G is closed, and a film forming process of an aluminum-containing material film is performed by the first film forming apparatus 101 on the titanium nitride film (TiN) formed on the wafer W.

After completion of the film forming process of the aluminum-containing material film, the gate valve G of the first film firming apparatus 101 is opened and the wafer W therein is unloaded by one of the transfer arms 307a and 307b of the transfer mechanism 306. Then, the gate valve G of the second film forming apparatus 102 is opened, the wafer W held by the transfer arm is loaded into the second film forming apparatus 102, and the empty transfer arm is returned to the vacuum transfer chamber 301. The gate valve G is closed, and a film forming process of a tungsten film is performed by the second film forming apparatus 102 on the aluminum-containing material film formed on the wafer W.

After the tungsten film is formed in this manner, the gate valve G of the second film forming apparatus 102 is opened and the wafer W therein is unloaded by one of the transfer arms 307a and 307b of the transfer mechanism 306. Then, the gate valve G1 of one of the load lock chambers 302 is opened, and the wafer W held on the transfer arm is loaded into the load lock chamber 302. Then, the inside of the load lock chamber 302 is returned to the atmosphere, the gate valve G2 is opened, and the wafer W in the load lock chamber 302 is returned to the carrier C by the transfer mechanism 308.

The above processes are performed concurrently on a plurality of wafers W, whereby the film forming process of the tungsten film for a predetermined number of wafers W is completed.

As described above, the film forming system 100 is formed by mounting one base film forming apparatus 201, one first film forming apparatus 101, and two second film forming apparatuses 102. This makes it possible to realize the formation of the titanium nitride film (TiN), the formation of the aluminum-containing material film, and the formation of the tungsten film with high throughput. Although the film forming system 100 of the present embodiment is shown as a vacuum processing system mounted with four film forming apparatuses, the number of film forming apparatuses is not limited thereto as long as the vacuum processing system is capable of mounting a plurality of film forming apparatuses. The number of film forming apparatuses may be four or more. For example, a vacuum processing system mounted with eight or more film forming apparatuses may be used.

[Configuration of Film Forming Apparatus]

The first film forming apparatus 101 and the second film forming apparatus 102 have substantially the same configuration. Hereinafter, the configuration of the first film forming apparatus 101 will be mainly described. As for the configuration of the second film forming apparatus 102, different parts will be mainly described.

Figure 2:
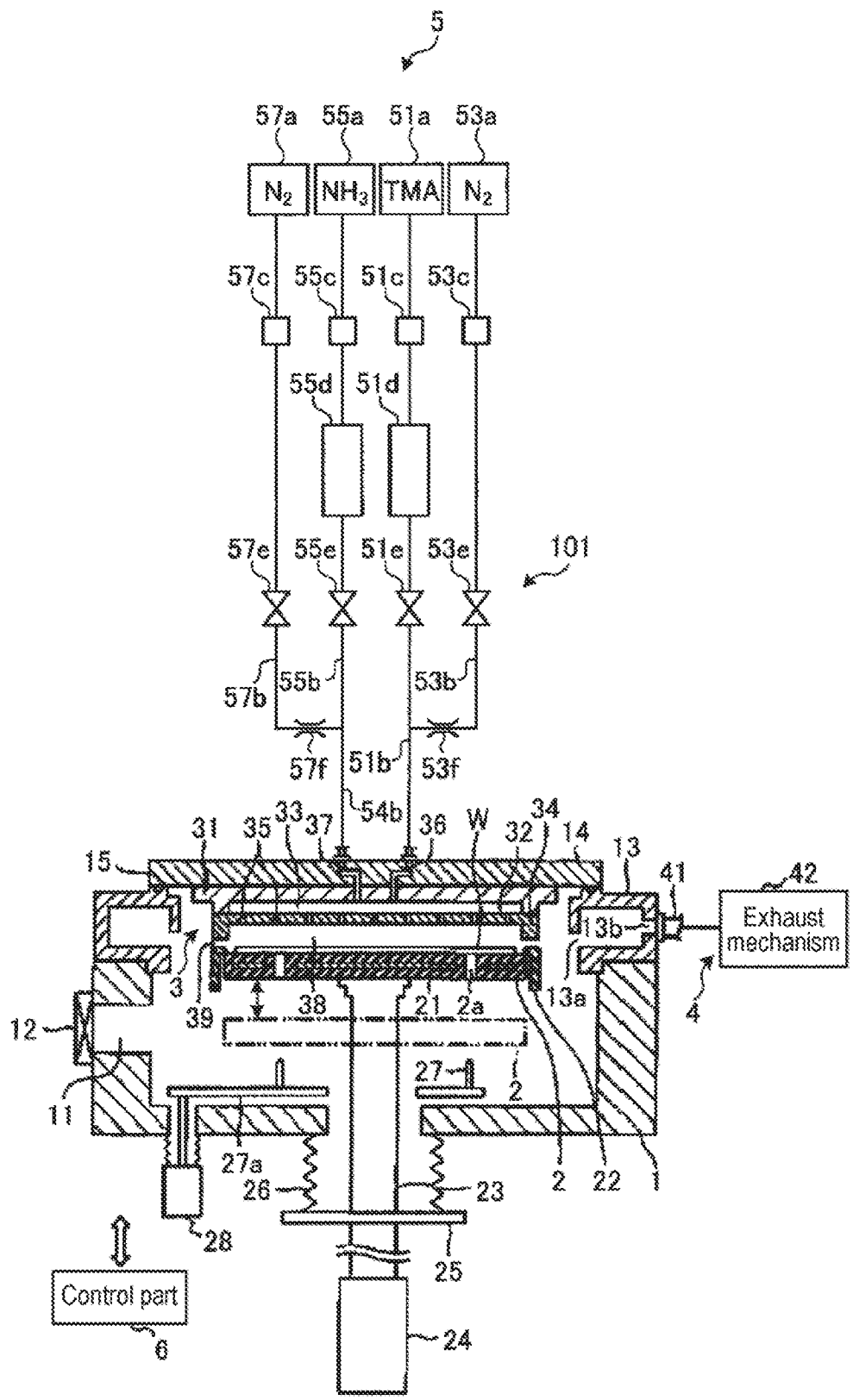
FIG. 2 is a schematic sectional view of a first film forming apparatus according to an embodiment.

The configuration of the first film forming apparatus 101 will be described. FIG. 2 is a schematic sectional view of the first film forming apparatus according to an embodiment. The first film forming apparatus 101 includes a processing container 1, a mounting table 2, a shower head 3, an exhaust part 4, a gas supply mechanism 5, and a control part 6.

The processing container 1 is made of a metal such as aluminum or the like and has a substantially cylindrical shape. The processing container 1 accommodates a wafer W as a substrate to be processed. A loading/unloading port 11 for loading or unloading the wafer W is formed on the side wall of the processing container 1. The loading/unloading port 11 is opened and closed by a gate valve 12. An annular exhaust duct 13 having a rectangular cross section is provided on the main body of the processing container 1. A slit 13a is formed in the exhaust duct 13 along the inner peripheral surface. An exhaust port 13b is formed in the outer wall of the exhaust duct 13. On the upper surface of the exhaust duct 13, a top wall 14 is provided so as to close the upper opening of the processing container 1. The space between the exhaust duct 13 and the top wall 14 is hermetically sealed by a seal ring 15.

The mounting table 2 horizontally supports the wafer W in the processing container 1. The mounting table 2 is formed in a disk shape having a size corresponding to the wafer W and is supported by a support member 23. The mounting table 2 is made of a ceramic material such as aluminum nitride (AlN) or the like, or a metallic material such as aluminum, nickel alloy, or the like. A heater 21 for heating the wafer W is buried in the mounting table 2. The heater 21 is supplied with electric power from a heater power supply (not shown) to generate heat. Then, the output of the heater 21 is controlled by a temperature signal of a thermocouple (not shown) provided in the vicinity of the upper surface of the mounting table 2, whereby the wafer W is controlled to a predetermined temperature. In the mounting table 2, a cover member 22 formed of ceramics such as alumina or the like is provided so as to cover the outer peripheral region of the upper surface and the side surface.

On the bottom surface of the mounting table 2, a support member 23 for supporting the mounting table 2 is provided. The support member 23 extends downward from the center of the bottom surface of the mounting table 2 through a hole formed in the bottom wall of the processing container 1. The lower end of the support member 23 is connected to an elevating mechanism 24. The mounting table 2 is raised and lowered via the support member 23 by the elevating mechanism 24 between a processing position shown in FIG. 2 and a transfer position located below the processing position as indicated by a two-dot chain line so that the wafer W can be transferred. A flange portion 25 is attached to the support member 23 on the lower side of the processing container 1. Between the bottom surface of the processing container 1 and the flange portion 25, there is provided a bellows 26 which isolates the atmosphere inside the processing container 1 from external air and which expands and contracts in response to the upward/downward movement of the mounting table 2.

Three wafer support pins 27 (only two of which are shown) are provided in the vicinity of the bottom surface of the processing container 1 so as to protrude upward from an elevating plate 27a. The wafer support pins 27 are raised and lowered via the elevating plate 27a by an elevating mechanism 28 provided below the processing container 1. The wafer support pins 27 are inserted through the through holes 2a provided in the mounting table 2 located at the transfer position and can protrude and retract with respect to the upper surface of the mounting table 2. By moving the wafer support pins 27 up and down, the delivery of the wafer W between the transfer mechanism (not shown) and the muffling table 2 is performed.

The shower head 3 supplies a processing gas into the processing container 1 in a shower shape. The shower head 3 is made of a metal and is provided so as to face the mounting table 2. The shower head 3 has substantially the same diameter as the mounting table 2. The shower head 3 includes a main body portion 31 fixed to the top wall 14 of the processing container 1 and a shower plate 32 connected to a lower portion of the main body portion 31. A gas diffusion space 33 is formed between the main body portion 31 and the shower plate 32. In the gas diffusion space 33, gas introduction holes 36 and 37 are provided so as to penetrate the top wall 14 of the processing container 1 and the center of the main body portion 31. An annular protrusion 34 protruding downward is formed in the peripheral edge portion of the shower plate 32. Gas discharge holes 35 are formed on the inner flat surface of the annular protrusion 34. In a state in which the mounting table 2 is located at the processing position, a processing space 38 is formed between the mounting table 2 and the shower plate 32, and the upper surface of the cover member 22 and the annular protrusion 34 come close to each other to form an annular gap 39.

The exhaust part 4 evacuates the inside of the processing container 1. The exhaust part 4 includes an exhaust pipe 41 connected to the exhaust port 13b and an exhaust mechanism 42 having a vacuum pump, a pressure control valve, and the like connected to the exhaust pipe 41. In a process, the gas in the processing container 1 is moved to the exhaust duct 13 via the slit 13a and is exhausted from the exhaust duct 13 through the exhaust pipe 41 by the exhaust mechanism 42.

The gas supply mechanism 5 is connected to the gas introduction holes 36 and 37 and is capable of supplying various gases used for film formation. For example, the gas supply mechanism 5 includes an Al-containing gas supply source 51a, an $N_2$ gas supply source 53a, an $NH_3$ gas supply source 55a, and an $N_2$ gas supply source 57a, which serve as gas supply sources for forming a film of an aluminum-containing material. In the gas supply mechanism 5 shown in FIG. 2, the respective gas supply sources are shown separately. However, gas supply sources capable of being used in common may be used in common.

The Al-containing gas supply source 51a supplies an Al-containing gas into the processing container 1 via a gas supply line 51b. Examples of the Al-containing gas include an $AlCl_3$ gas and a TMA (trimethylaluminum: $C_6H_{18}Al_2$) gas. In the gas supply line 51b, a flow rate controller 51c, a storage tank 51d, and a valve 51e are installed sequentially from the upstream side. On the downstream side of the valve 51e, the gas supply line 51b is connected to the gas introduction hole 36. The Al-containing gas supplied from the Al-containing gas supply source 51a is temporarily stored in the storage tank 51d before being supplied into the processing container 1, pressurized to a predetermined pressure in the storage tank 51d, and then supplied to the processing container 1. The supply and cutoff of the Al-containing gas to be supplied from the storage tank 51d to the processing container 1 is performed by the valve 51e. By temporarily storing the Al-containing gas in the storage tank 51d in this manner, the Al-containing gas can be stably supplied into the processing container 1 at a relatively large flow rate.

The $N_2$ gas supply source 53a supplies an $N_2$ gas as a carrier gas into the processing container 1 via a gas supply line 53b. In the gas supply line 53b, a flow rate controller 53c, a valve 53e, and an orifice 53f are installed sequentially from the upstream side. On the downstream side of the orifice 53f, the gas supply line 53b is connected to the gas supply line 51b. The $N_2$ gas supplied from the $N_2$ gas supply source 53a is continuously supplied into the processing container 1 during the film formation on the wafer W. The supply and cutoff of the $N_2$ gas to be supplied from the $N_2$ gas supply source 53a to the processing container 1 are performed by the valve 53e. The gas is supplied to the gas supply line 51b at a relatively large flow rate by the storage tank 51d. The gas supplied to the gas supply line 51b is prevented from flowing back to the gas supply line 53b by the orifice 53f.

The $NH_3$ gas supply source 55a supplies an $NH_3$ gas as a reducing gas into the processing container 1 via a gas supply line 55b. In the gas supply line 55b, a flow rate controller 55c, a storage tank 55d, and a valve 55e are installed sequentially from the upstream side. On the downstream side of the valve 55e, the gas supply line 55b is connected to the gas supply line 54b. The downstream side of the gas supply line 54b is connected to the gas introduction hole 37. An $NH_3$ gas supplied from the $NH_3$ gas supply source 55a is temporarily stored in the storage tank 55d before being supplied into the processing container 1, pressurized to a predetermined pressure in the storage tank 55d, and then introduced into the processing container 1. The supply and cutoff of the $NH_3$ gas to be supplied from the storage tank 55d to the processing container 1 are performed by the valve 55e. By temporarily storing the $NH_3$ gas in the storage tank 55d in this manner, the $NH_3$ gas can be stably supplied into the processing container 1 at a relatively large flow rate.

The $N_2$ as supply source 57a supplies an $N_2$ gas as a carrier gas into the processing container 1 via a gas supply line 57b. In the gas supply line 57b, a flow rate controller 57c, a valve 57e, and an orifice 57f are installed sequentially from the upstream side. On the downstream side of the orifice 57f, the gas supply line 57b is connected to the gas supply line 54b. The $N_2$ gas supplied from the $N_2$ gas supply source 57a is continuously supplied into the processing container 1 during the film formation on the wafer W. The supply and cutoff of the $N_2$ gas to be supplied from the $N_2$ gas supply source 57a to the processing container 1 are performed by the valve 57e. The gas is supplied to the gas supply line 55b at a relatively large flow rate by the storage tank 55d. The gas supplied to the gas supply line 55b is prevented from flowing back to the gas supply line 57b by the orifice 57f.

The operation of the first film forming apparatus 101 configured as described above is generally controlled by the control part 6. The control part 6 is, for example, a computer, and includes a CPU (Central Processing Unit), a RAM (Random Access Memory), a ROM (Read Only Memory), an auxiliary storage device, and the like. The CPU operates based on a program stored in the ROM or the auxiliary storage device, and controls the overall operation of the apparatus. The control part 6 may be provided inside the first film forming apparatus 101 or may be provided outside the first film forming apparatus 101. When the control part 6 is provided outside the first film forming apparatus 101, the control part 6 can control the first film forming apparatus 101 by a wired or wireless communication means.

Figure 3:
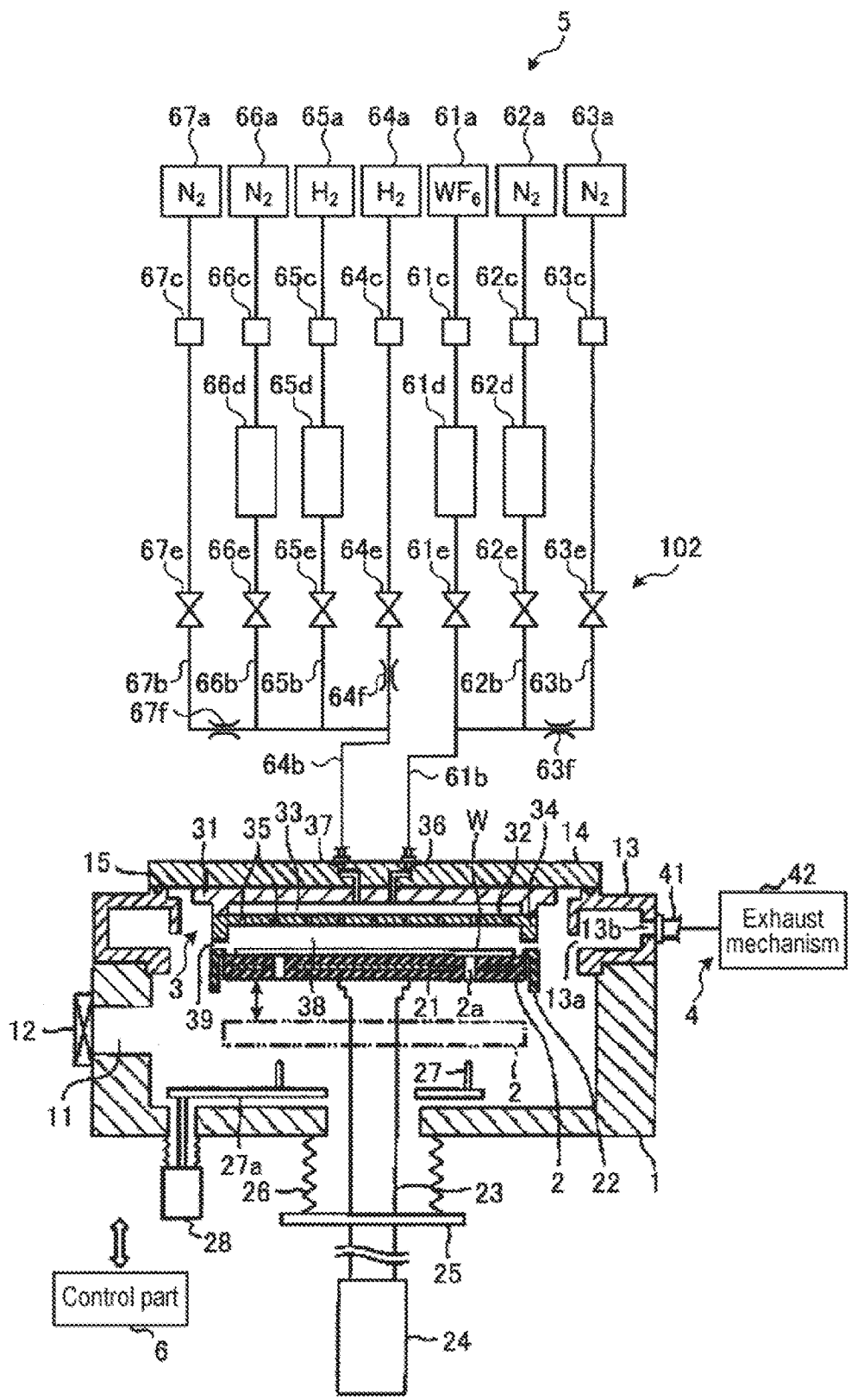
FIG. 3 is a schematic sectional view of a second film forming apparatus according to an embodiment.

Next, the configuration of the second film forming apparatus 102 will be described. FIG. 3 is a schematic sectional view of the second film forming apparatus 102 according to the embodiment. The second film forming apparatus 102 has the same configuration as the first film forming apparatus 101 except for the gas to be used and the gas supply mechanism 5 for supplying the gas. The parts of the second film forming apparatus 102 which are the same as those of the first film forming apparatus 101 are denoted by like reference numerals, and a description thereof will be omitted. Different points will be mainly described.

The gas supply mechanism 5 is connected to gas introduction holes 36 and 37, and is capable of supplying various gases used for film formation. For example, the gas supply mechanism 5 includes a $WF_6$ gas supply source 61a, an $N_2$ gas supply source 62a, an $N_2$ gas supply source 63a, an $H_2$ gas supply source 64a, an $H_2$ gas supply source 65a, an $N_2$ gas supply source 66a, and an $N_2$ gas supply source 67a. Even in the gas supply mechanism 5 shown in FIG. 3, the respective gas supply sources are separately shown. However, the gas supply sources capable of being used in common may be used in common.

The $WF_6$ gas supply source 61a supplies a $WF_6$ gas into the processing container 1 via a gas supply line 61b. In the gas supply line 61b, a flow rate controller 61c, a storage tank 61d, and a valve 61e are installed sequentially from the upstream side. On the downstream side of the valve 61e, the gas supply line 61b is connected to the gas introduction hole 36. The $WF_6$ gas supplied from the $WF_6$ gas supply source 61a is temporarily stored in the storage tank 61d before being supplied into the processing container 1, pressurized to a predetermined pressure in the storage tank 61d, and then supplied into the processing container 1. The supply and cutoff of the $WF_6$ gas to be supplied from the storage tank 61d to the processing container 1 is performed by the valve 61e. By temporarily storing the $WF_6$ gas in the storage tank 61d in this manner, the $WF_6$ gas can be stably supplied into the processing container 1 at a relatively large flow rate.

The $N_2$ gas supply source 62a supplies an $N_2$ gas as a purge gas into the processing container 1 via a gas supply line 62b. In the gas supply line 62b, a flow rate controller 62c, a storage tank 62d, and a valve 62e are installed sequentially from the upstream side. On the downstream side of the valve 62e, the gas supply line 62b is connected to the gas supply line 61b. The $N_2$ gas supplied from the $N_2$ gas supply source 62a is temporarily stored in the storage tank 62d before being supplied into the processing container 1, pressurized to a predetermined pressure in the storage tank 62d, and then supplied into the processing container 1. The supply and cutoff of the $N_2$ gas to be supplied from the storage tank 62d to the processing container 1 is performed by the valve 62e. By temporarily storing the $N_2$ gas in the storage tank 62d in this manner, the $N_2$ gas can be stably supplied into the processing container 1 at a relatively large flow rate.

The $N_2$ gas supply source 63a supplies an $N_2$ gas as a carrier gas into the processing container 1 via a gas supply line 63b. In the gas supply line 63b, a flow rate controller 63c, a valve 63e, and an orifice 63f are installed sequentially from the upstream side. On the downstream side of the orifice 63f, the gas supply line 63b is connected to the gas supply line 61b. The $N_2$ gas supplied from the $N_2$ gas supply source 63a is continuously supplied into the processing container 1 during the film formation on the wafer W. The supply and cutoff of the $N_2$ gas to be supplied from the $N_2$ gas supply source 63a to the processing container 1 are performed by the valve 63e. The gas is supplied to the gas supply lines 61b and 62b at a relatively large flow rate by the storage tanks 61d and 62d. The gas supplied to the gas supply lines 61b and 62b is prevented from flowing back to the gas supply line 63b by the orifice 63f.

The $H_2$ gas supply source 64a supplies an $H_2$ gas as a reducing gas into the processing container 1 via a gas supply line 64b. In the gas supply line 64b, a flow rate controller 64c, a valve 64e, and an orifice 64f are installed sequentially from the upstream side. On the downstream side of the orifice 64f, the gas supply line 64b is connected to the gas introduction hole 37. The $H_2$ gas supplied from the $H_2$ gas supply source 64a is continuously supplied into the processing container 1 during the film formation on the wafer W. The supply and cutoff of the $H_2$ gas to be supplied from the $H_2$ gas supply source 64a to the processing container 1 are performed by the valve 64e. The gas is supplied to the gas supply lines 65b and 66b at a relatively large flow rate by the storage tanks 65d and 66d which will be described later. The gas supplied to the gas supply lines 65b and 66b is prevented from flowing back into the gas supply line 64b by the orifice 64f.

The $H_2$ gas supply source 65a supplies an $H_2$ gas as a reducing gas into the processing container 1 via a gas supply line 65b. In the gas supply line 65b, a flow rate controller 65c, a storage tank 65d, and a valve 65e are installed sequentially from the upstream side. On the downstream side of the valve 65e, the gas supply line 65b is connected to the gas supply line 64b. The $H_2$ gas supplied from the $H_2$ gas supply source 65a is temporarily stored in the storage tank 65d before being supplied into the processing container 1, pressurized to a predetermined pressure in the storage tank 65d, and then supplied into the processing container 1. The supply and cutoff of the $H_2$ gas to be supplied from the storage tank 65d to the processing container 1 is performed by the valve 65e. By temporarily storing the $H_2$ gas in the storage tank 65d in this manner, the $H_2$ gas can be stably supplied into the processing container 1 at a relatively large flow rate.

The $N_2$ gas supply source 66a supplies an $N_2$ gas as a purge gas into the processing container 1 via a gas supply line 66b. In the gas supply line 66b, a flow rate controller 66c, a storage tank 66d, and a valve 66e are installed sequentially from the upstream side. On the downstream side of the valve 66e, the gas supply line 66b is connected to the gas supply line 64b. The $N_2$ gas supplied from the $N_2$ gas supply source 66a is temporarily stored in the storage tank 66d before being supplied into the processing container 1, pressurized to a predetermined pressure in the storage tank 66d, and then supplied into the processing container 1. The supply and cutoff of the $N_2$ gas to be supplied from the storage tank 66d to the processing container 1 are performed by the valve 66e. By temporarily storing the $N_2$ gas in the storage tank 66d in this manner, the $N_2$ gas can be stably supplied into the processing container 1 at a relatively large flow rate.

The $N_2$ gas supply source 67a supplies an $N_2$ gas as a carrier gas into the processing container 1 via a gas supply line 67b. In the gas supply line 67b, a flow rate controller 67c, a valve 67e, and an orifice 67f are installed sequentially from the upstream side. On the downstream side of the orifice 67f, the gas supply line 67b is connected to the gas supply line 64b. The $N_2$ gas supplied from the $N_2$ gas supply source 67a is continuously supplied into the processing container 1 during the film formation on the wafer W. The supply and cutoff of the $N_2$ gas to be supplied from the $N_2$ gas supply source 67a to the processing container 1 are performed by the valve 67e. The gas is supplied to the gas supply lines 65b and 66b at a relatively large flow rate by the storage tanks 65d and 66d. The gas supplied to the gas supply lines 65b and 66b is prevented from flowing back to the gas supply line 67b by the orifice 67f.

[Film Forming Method]

Next, a tungsten film forming method, which is performed using the forming system 100 configured as described above, will be described. FIG. 4 is a flowchart showing the flow of respective steps of a film forming method according to an embodiment. FIGS. 5A to 5D are sectional views schematically showing the states of a wafer in the respective steps of the film forming method according to the embodiment.

First, in the film forming method according to the present embodiment, a wafer W (FIG. 5A) having a titanium nitride (TiN) film as a base film formed on the surface of a silicon film having a recess such as, for example, a trench or a hole, is prepared. In reality, a recess such as a trench or a hole (a contact hole or via hole) is formed in the wafer W. However, for the sake of convenience, the recess is omitted in FIGS. 5A to 5D.

Figure 5A:
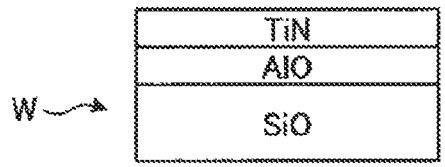
FIGS. 5A to 5D are sectional views schematically showing the states of a wafer in the respective steps of the film forming method according to an embodiment.
Figure 5B:
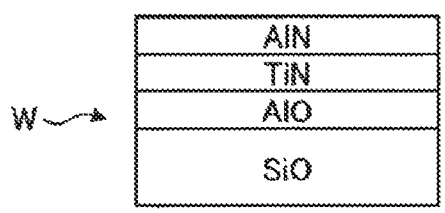

The first film forming apparatus 101 forms a film of an aluminum-containing material on the wafer W by an ALD (Atomic Layer Deposition) method (step S1: FIG. 5B). For example, in the first film forming apparatus 101, an Al-containing gas and a reducing gas are supplied into the processing container 1 to form an AlN film as a film of an aluminum-containing material. Details of the step of forming the AlN film will be described later.

Figure 5C:
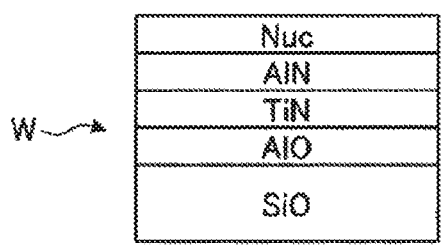

The second film forming apparatus 102 supplies a $WF_6$ gas and an $SiH_4$ gas into the processing container 1 to form a nucleation film as an initial tungsten film for generating tungsten nuclei on the surface of the wafer W (step S2: FIG. 5C). Step S3 is a process for facilitating the formation of the next tungsten film, but is not necessarily required. The step S3 may be a step in which the second film forming apparatus 102 treats the surface of the wafer W by supplying an $SiH_4$ gas into the processing container 1 for a predetermined time.

Figure 5D:
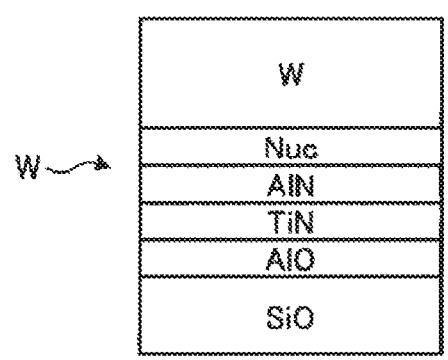

Next, the second film forming apparatus 102 forms a tungsten film on the wafer W (step S3: FIG. 5D). Details of the step of forming the tungsten film will be described later.

[Formation of AlN Film]

Figure 6:
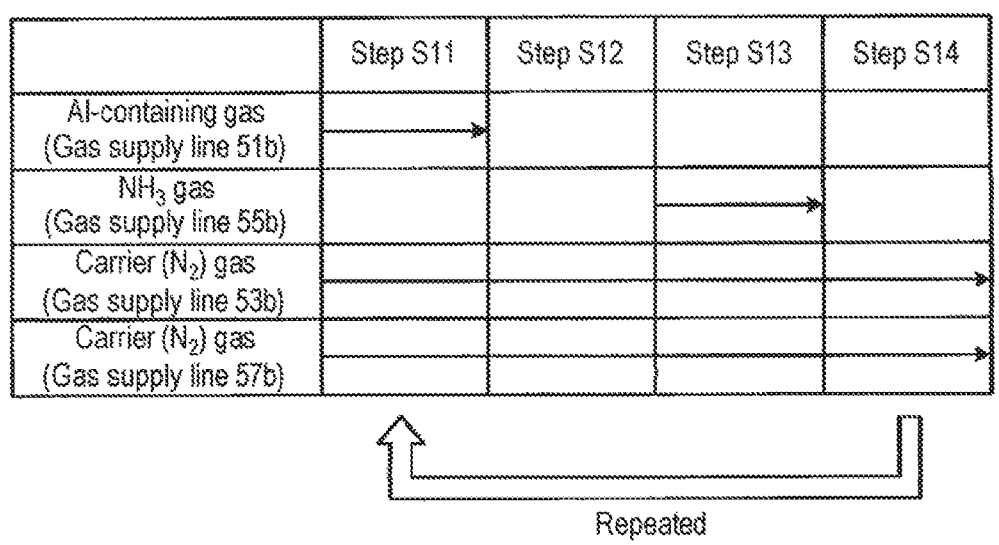
FIG. 6 is a diagram showing a gas supply sequence at the time of forming an AlN film according to an embodiment.

Next, a flow of forming an AlN film by the first film forming apparatus 101 will be described. FIG. 6 is a diagram showing a gas supply sequence at the time of forming the AlN film according to the embodiment.

The control part 6 of the first film forming apparatus 101 controls the heater 21 of the mounting table 2 to heat the wafer W to a predetermined temperature (for example, 250 to 650 degrees C.). Further, the control part 6 controls the pressure control valve of the exhaust mechanism 42 to adjust the pressure in the processing container 1 to a predetermined pressure (for example, $1.3 \times 10^1$ to $8.0 \times 10^3$ Pa).

The control part 6 opens the valves 53e and 57e and supplies a carrier gas ($N_2$ gas) at a predetermined flow rate (for example, 100 to 10000 sccm) from the $N_2$ gas supply sources 53a and 57a to the gas supply lines 53b and 57b, respectively. In addition, the control part 6 supplies an Al-containing gas and an $NH_3$ gas from the Al-containing gas supply source 51a and the $NH_3$ gas supply source 55a to the gas supply lines 51b and 55b, respectively. At this time, since the valves 51e and 55e are closed, the Al-containing gas and the $NH_3$ gas are respectively stored in the storage tanks 51d and 55d, and the pressure in the storage tanks 51d and 55d is increased.

Next, the control part 6 opens the valve 51e, supplies the Al-containing gas stored in the storage tank 51d into the processing container 1, and causes the film of the aluminum-containing material to be adsorbed on the surface of the wafer W (step S11). For example, when an $AlCl_3$ gas is used as the Al-containing gas, the $AlCl_3$ gas goes through a reaction of $AlCl_3 + NH_3 \rightarrow AlN + HCl \uparrow$ and AlN adsorbs on the surface of the wafer W. Moreover, for example, when a TMA gas is used as the Al-containing gas, the TMA gas goes through a reaction of $C_6H_{18}Al_2 + NH_3 \rightarrow AlN + C_xH_y \uparrow$, and AlN adsorbs on the surface of the wafer W.

After a predetermined time (for example, 0.05 to 5 seconds) has elapsed since the opening of the valve 51e, the control part 6 closes the valve 51e and stops the supply of the Al-containing gas into the processing container 1 (step S12). As the valve 51e is closed, the Al-containing gas supplied from the Al-containing gas supply source 51a to the gas supply line 51b is stored in the storage tank 51d, and the pressure in the storage tank 51d is increased. In addition, since the valve 51e is closed, the carrier gas ($N_2$) supplied from the gas supply line 53b and the gas supply line 57b may also function as a purge gas to exhaust an excess Al-containing gas (step S12).

After a predetermined time (for example, 0.05 to 5 seconds) has elapsed since the closing of the valve 51e, the control part 6 opens the valve 55e and supplies the $NH_3$ gas stored in the storage tank 55d into the processing container 1, thereby reducing the Al-containing gas adsorbed on the surface of the wafer W (step S13).

After a predetermined time (for example, 0.05 to 5 seconds) has elapsed since the opening of the valve 55e, the control part 6 closes the valve 55e and stops the supply of the $NH_3$ gas into the processing container 1 (step S14). As the valve 55e is closed, the $NH_3$ gas supplied from the $NH_3$ gas supply source 55a to the gas supply line 55b is stored in the storage tank 55d, and the pressure in the storage tank 55d is increased. In addition, as the valve 51e is closed, the carrier gas ($N_2$) supplied from the gas supply line 53b and the gas supply line 57b may also function as a purge gas to exhaust an excess Al-containing gas (step S14).

The control part 6 forms an AlN film having a desired film thickness by repeating the cycle of steps S11 to S14 for a plurality of cycles (for example, 10 to 1000 cycles).

The gas supply sequence and the process gas conditions at the time of forming the AlN film shown in FIG. 6 are merely examples, and the present disclosure is not limited thereto. The AlN film may be formed by using other gas supply sequences and other process gas conditions.

[Formation of Tungsten Film]

Figure 7:
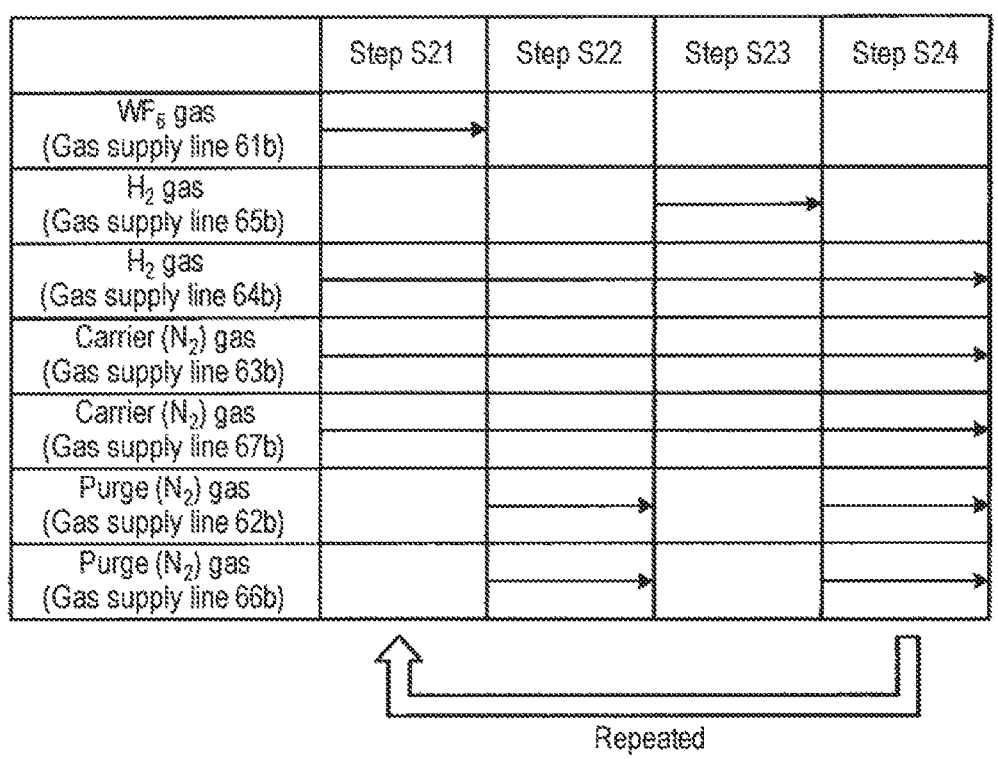
FIG. 7 is a diagram showing a gas supply sequence at the time of forming a tungsten film according to an embodiment.

Next, a flow of forming a tungsten film by the second film forming apparatus 102 will be described. FIG. 7 is a diagram showing a gas supply sequence at the time of forming a tungsten film according to an embodiment.

The control part 6 of the second film forming apparatus 102 controls the heater 21 of the mounting table 2 to heat the wafer W to a predetermined temperature (for example, 250 to 650 degrees C.). Further, the control part 6 controls the pressure control valve of the exhaust mechanism 42 to adjust the pressure in the processing container 1 to a predetermined pressure (for example, $1.3 \times 10^1$ to $8.0 \times 10^3$ Pa).

The control part 6 opens the valves 63e and 67e and supplies a carrier gas ($N_2$ gas) at a predetermined flow rate (for example, 100 to 8000 sccm) from the N₂ gas supply sources 63a and 67a to the gas supply lines 63b and 67b, respectively. Further, the control part 6 opens the valve 64e and supplies at a predetermined flow rate (for example, 100 to 20000 sccm) from the H₂ gas supply source 64a to the gas supply line 64b. Moreover, the control part 6 supplies a WF₆ gas and an H₂ gas from the WF₆ gas supply source 61a and the H₂ gas supply source 65a, respectively, to the gas supply lines 61b and 65b. At this time, since the valves 61e and 65e are closed, the WF₆ gas and the H₂ gas are respectively stored in the storage tanks 61d and 65d, and the pressure in the storage tanks 61d and 65d is increased.

Next, the control part 6 opens the valve 61e, supplies the WF₆ gas stored in the storage tank 61d into the processing container 1, and causes the WF₆ gas to be adsorbed on the surface of the wafer W (step S21). In parallel with the supply of the WF₆ gas into the processing container 1, the control part 6 supplies a purge gas (N₂ gas) from the N₂ gas supply sources 62a and 66a to the gas supply lines 62b and 66b, respectively. At this time, by closing the valves 62e and 66e, the purge gas is stored in the storage tanks 62d and 66d, and the pressure in the storage tanks 62d and 66d is increased.

After a predetermined time (for example, 0.05 to 5 seconds) has elapsed since the opening of the valve 61e, the control part 6 closes the valve 61e and opens the valves 62e and 66e to stop the supply of the WF₆ gas into the processing container 1 and to supply the purge gas stored in the storage tanks 62d and 66d into the processing container 1 (step S22). At this time, the purge gas is supplied from the storage tanks 62d and 66d having an increased pressure. Therefore, the purge gas is supplied into the processing container 1 at a relatively large flow rate, for example, a flow rate (for example, 500 to 10000 sccm) larger than the flow rate of the carrier gas. Thus, the WF₆ gas remaining in the processing container 1 is promptly discharged to the exhaust pipe 41, and the inside of the processing container 1 is changed from the WF₆ gas atmosphere to the atmosphere containing the H₂ gas and the N₂ gas in a short time. On the other hand, as the valve 61e is closed, the WF₆ gas supplied from the WF₆ gas supply source 61a to the gas supply line 61b is stored in the storage tank 61d, and the pressure in the storage tank 61d is increased.

After a predetermined time (for example, 0.05 to 5 seconds) has elapsed since the opening of the valves 62e and 66e, the control part 6 closes the valves 62e and 66e and opens the valve 65e to stop the supply of the purge gas into the processing container 1 and to supply the H₂ gas stored in the storage tank 65d into the processing container 1, thereby reducing the WF₆ gas adsorbed on the surface of the wafer W (step S23). At this time, due to the closing of the valves 62e and 66e, the purge gas supplied from the N₂ gas supply sources 62a and 66a to the gas supply lines 62b and 66b, respectively, is stored in the storage tanks 62d and 66d, and the pressure in the storage tanks 62d and 66d is increased.

After a predetermined time (for example, 0.05 to 5 seconds) has elapsed since the opening of the valve 65e, the control part 6 closes the valve 65e and opens the valves 62e and 66e to stop the supply of the H₂ gas into the processing container 1 and to supply the purge gas stored in the storage tanks 62d and 66d into the processing container 1 (step S24). At this time, the purge gas is supplied from the storage tanks 62d and 66d having an increased pressure. Therefore, the purge gas is supplied into the processing container 1 at a relatively large flow rate, for example, a flow rate (for example, 500 to 10000 sccm) larger than the flow rate of the carrier gas. Thus, the H₂ gas remaining in the processing container 1 is promptly discharged to the exhaust pipe 41, and the inside of the processing container 1 is changed from the H₂ gas atmosphere to the atmosphere containing the H₂ gas and the N₂ gas in a short time. On the other hand, due to the closing of the valve 65e, the H₂ gas supplied from the H₂ gas supply source 65a to the gas supply line 65b is stored in the storage tank 65d, and the pressure in the storage tank 65d is increased.

The control part 6 forms a tungsten film having a desired film thickness by repeating the cycle of steps S21 to S24 for a plurality of cycles (for example, 50 to 2000 cycles).

The gas supply sequence and the process gas conditions at the time of forming the tungsten film shown in FIG. 7 are merely examples, and the present disclosure is not limited thereto. The tungsten film may be formed by using other gas supply sequences and other process gas conditions.

[Action and Effect]

Figure 8:
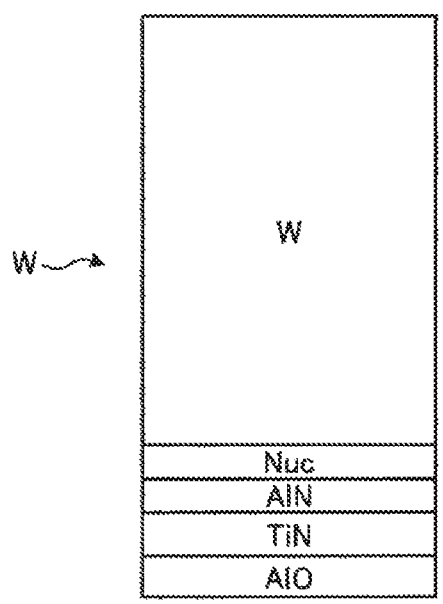
FIG. 8 is a diagram showing an example of a layer configuration of a wafer according to the present embodiment.

Next, the actions and effects of the film forming method according to the present embodiment will be described. FIG. 8 is a diagram showing an example of the layer configuration of the wafer according to the present embodiment. FIG. 8 shows an example of the layer configuration of the wafer W on which films are formed by the film forming method according to the present embodiment. In the wafer W, an AlO layer for blocking is formed on a silicon (SiO₂) layer, and a TiN film having a thickness of, for example, 1 nm is formed on the AlO layer from the viewpoint of adhesion and reaction suppression. Then, in the wafer W, an AlN film having a thickness of, for example, 1 nm is formed on the TiN film by the film forming method according to the present embodiment, and a nucleation film (Nuc) having a thickness of, for example, 1 nm is formed as an initial tungsten film on the AlN film. Then, in the wafer W, a low-resistance tungsten film (W) is formed on the nucleation film.

One example of the process conditions of the film forming method according to the embodiment will now be summarized below.

AlN Film
Temperature: 250 to 550 degrees C.
Pressure: 0.1 to 10 Torr
Al-containing gas: 10 to 500 sccm
Carrier gas (N₂): 1000 to 10000 sccm
Purge gas (N₂): 0 to 10000 sccm
NH₃ gas: 1000 to 10000 sccm
Time:
Al-containing gas: 0.05 to 5 seconds
Purge: 0.05 to 5 seconds
NH₃ gas: 0.05 to 5 seconds
Purge: 0.05 to 5 seconds
Nucleation Film
Temperature: 250 to 550 degrees C.
Pressure: 1 to 100 Torr
W-containing gas: 10 to 500 sccm
Carrier gas (N₂): 1000 to 10000 sccm
Purge gas (N₂): 0 to 10000 sccm
H₂ gas: 500 to 20000 sccm
SiH₄ gas: 10 to 1000 sccm
Time:
W-containing gas: 0.05 to 15 seconds
Purge: 0.05 to 15 seconds
SiH₄ gas: 0.05 to 15 seconds
Purge: 0.05 to 15 seconds
W Film
Temperature: 250 to 550 degrees C.
Pressure: 0.1 to 20 Torr
W-containing gas: 100 to 500 sccm
Carrier gas (N₂): 1000 to 10000 sccm Purge gas (N$_2$): 0 to 10000 sccm
H$_2$ gas: 500 to 20000 sccm
Time:
W-containing gas: 0.05 to 15 seconds
Purge: 0.05 to 15 seconds
H$_2$ gas: 0.05 to 15 seconds
Purge: 0.05 to 15 seconds In the wafer W, by forming the AlN film on the TiN film before forming the tungsten film as described above, the AlN film can cancel the orientation of TiN. The AlN film preferably has a thickness of about 1 to 2 nm. If the thickness is about 1 nm, it is possible to cancel the orientation of the underlying TiN. As a result, in the wafer W, grains of tungsten to be deposited can be caused to grow into a larger size and the resistance of the tungsten film can be reduced.

Furthermore, in the wafer W, by forming the nucleation film, it is possible to enhance the adhesion of tungsten to be deposited. In addition, it is possible to enhance the uniformity of tungsten to be deposited. The thickness of the nucleation film is preferably about 0.5 to 5 nm.

Figure 9:
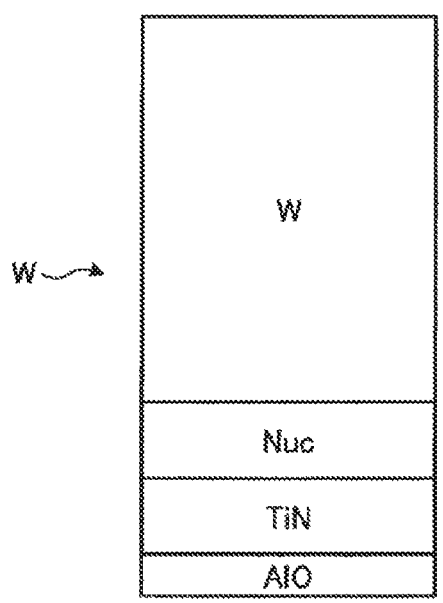
FIG. 9 is a diagram showing an example of a layer configuration of a wafer according to a comparative example.

The effects will be described using a comparative example. FIG. 9 is a diagram showing an example of a layer configuration of a wafer according to a comparative example. FIG. 9 shows an example of a layer configuration of a conventional wafer W. In the wafer W, an AlO layer for blocking is formed on a silicon (SiO$_2$) layer, and a TiN film having a thickness of, for example, 2 nm is formed on the AlO layer from the viewpoint of adhesion and reaction suppression. Then, in the wafer W, a tungsten nucleation film (Nuc) having a thickness of, for example, 3 nm is formed on the TiN film. Then, in the wafer W, a low-resistance tungsten film (W) is formed on the nucleation film.

Figure 10:
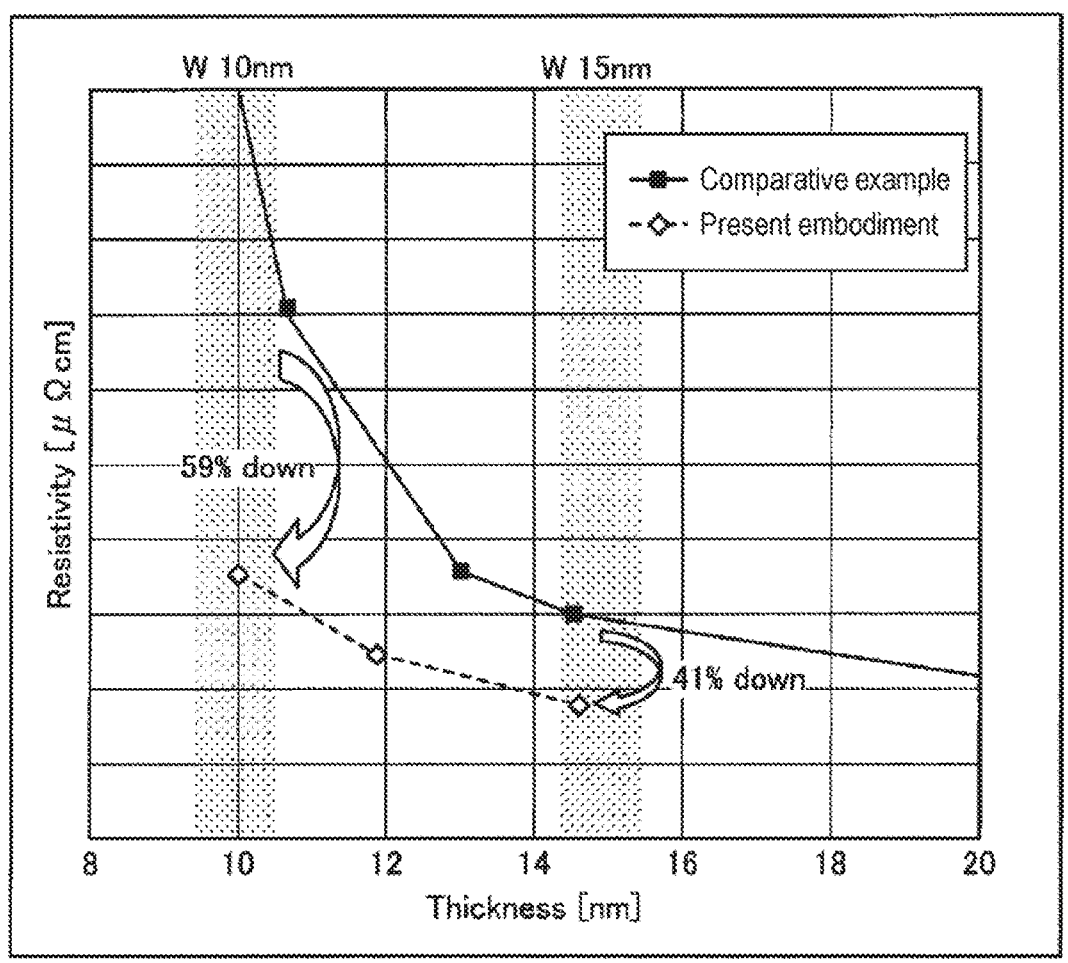
FIG. 10 is a diagram showing an example of a change in resistivity with respect to a thickness of a tungsten film.

An example of the process conditions for forming each film of the comparative example will be described below.
Nucleation Film
Temperature: 250 to 550 degrees C.
Pressure: 1 to 100 Torr
W-containing gas: 10 to 500 sccm
Carrier gas (N$_2$): 1000 to 10000 sccm
Purge gas (N$_2$): 0 to 10000 sccm
H$_2$ gas: 500 to 20000 sccm
SiH$_4$ gas: 10 to 1000 sccm
Time:
W-containing gas: 0.05 to 15 seconds
Purge: 0.05 to 15 seconds
SiH$_4$ gas: 0.05 to 15 seconds
Purge: 0.05 to 15 seconds
W Film
Temperature: 250 to 550 degrees C.
Pressure: 0.1 to 20 Torr
W-containing gas: 100 to 500 sccm
Carrier gas (N$_2$): 1000 to 10000 sccm
Purge gas (N$_2$): 0 to 10000 sccm
H$_2$ gas: 500 to 20000 sccm
Time:
W-containing gas: 0.05 to 15 seconds
Purge: 0.05 to 15 seconds
H$_2$ gas: 0.05 to 15 seconds
Purge: 0.05 to 15 seconds FIG. 10 is a diagram showing an example of a change in resistivity with respect to the thickness of the tungsten film. FIG. 10 shows a change in resistivity depending on the thickness of the tungsten film in the layer configuration of the present embodiment shown in FIG. 8 and the layer configuration of the comparative example shown in FIG. 9. In the example of FIG. 10, the thickness of the tungsten film is measured from the interface with the TiN film. That is, in the layer configuration of the present embodiment, the thickness of the AlN film, the nucleation film (Nuc), and the tungsten film (W) is regarded as the thickness of the tungsten film. In the layer configuration of the comparative example, the thickness of the nucleation film (Nuc) and the tungsten film (W) is regarded as the thickness of the tungsten film. In the example of FIG. 10, there is shown the resistivity normalized with reference to the resistivity of the comparative example when the thickness is 10 nm. As shown in FIG. 10, when the thickness is 10 nm, the resistivity of the layer configuration of the present embodiment is lower by 59% than that of the comparative example. When the thickness is 15 nm, the resistivity of the layer configuration of the present embodiment is lower by 41% than that of the comparative example.

As described earlier, the wiring of the LSI is miniaturized, and the reduction in the resistance of the wiring is required. For example, in a three-dimensional stacked semiconductor memory such as a 3D NAND flash memory or the like, a tungsten film is formed as a word line. For purposes of miniaturization, it is required to further reduce the resistance of the tungsten film.

On the other hand, in the layer configuration of the present embodiment, it is possible to reduce the resistance of the tungsten film even when the film thickness is made small.

Conventionally, when forming a nucleation film, a boron (B$_2$H$_6$) gas is used as a reducing gas. However, boron may adversely affect the wafer W in some cases.

On the other hand, when forming the nucleation film according to the present embodiment, an adverse effect can be suppressed by using the SiH$_4$ gas as a reducing gas.

In the layer configuration of the present embodiment shown FIG. 8, there is shown a case where the nucleation film is provided. However, the nucleation film is not necessarily required. Instead of forming the nucleation film, a SiH$_4$ gas may be supplied into the processing container 1 for a predetermined time to treat the surface of the wafer W. The predetermined time is preferably, for example, about 300 seconds or more.

Further, in the present embodiment, there has been described the case where the AlN film and the tungsten film are formed by separate film forming apparatuses. However, the present disclosure is not limited thereto. For example, the AlN film and the tungsten film may be formed by a single film forming apparatus having a gas supply mechanism for forming an AlN film and a gas supply mechanism for forming a tungsten film. Further, the wafer W may be transferred through the respective film forming apparatuses under the atmospheric pressure.

As described above, in the tungsten film forming method according to the present embodiment, a first film of an aluminum-containing material is formed on the surface of the wafer W disposed in the processing container 1 and having the TiN film formed on the surface thereof, while heating the wafer W in a reduced pressure atmosphere. Then, in the tungsten film forming method according to the present embodiment, a tungsten film is formed on the first film. This makes it possible to reduce the resistance of the tungsten film even when the film thickness is made small.

In addition, in the tungsten film forming method according to the present embodiment, at least one of an AlCl$_3$ gas and a TMA gas, and a reducing gas are supplied into the processing container 1 to form an AlN film as a first film. As a result, the orientation of the TiN film is canceled by the AlN film, and the grains of deposited tungsten can be caused to grow large. This makes it possible to reduce the resistance of the tungsten film.

Further, in the tungsten film forming method according to the present embodiment, after the formation of the first film and before the step of forming the tungsten film, a $WF_6$ gas and a $SiH_4$ gas are supplied into the processing container 1 to form an initial tungsten film for forming tungsten nuclei on the surface of the wafer W, or a $SiH_4$ gas is supplied into the processing container 1 to treat the surface of the wafer W. Thus, it is possible to enhance the adhesion of tungsten to be deposited. In addition, it is possible to enhance the uniformity of tungsten to be deposited.

Although the embodiment has been described above, various modifications may be made without being limited to the above-described embodiment. For example, although a semiconductor wafer has been described as an example of a substrate, the semiconductor wafer may be silicon, or a compound semiconductor such as GaAs, SiC, GaN or the like. Furthermore, the substrate is not limited to the semiconductor wafer. The present disclosure may also be applied to a glass substrate used for an FPD (flat panel display) such as a liquid crystal display device or the like, a ceramic substrate, and the like.

According to one aspect of the tungsten film forming method disclosed herein, it is possible to reduce the resistance of a tungsten film even when the tungsten film is made thin.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A tungsten film forming method using a film forming apparatus, wherein the film forming apparatus apparatus includes a processing container, an exhaust part, a heating mechanism, a gas supply mechanism including an aluminum-containing gas supply source, and a tungsten-containing gas supply source,
   the method comprising:
   forming a first film of an aluminum-containing material on a surface of a substrate having a TiN film, the TiN film being formed on the substrate in the processing container while heating the substrate in a reduced pressure atmosphere; and
   forming a tungsten film on the first film in the processing container while heating the substrate having the first film formed thereon in a reduced pressure atmosphere.

2. The method of claim 1, wherein in the act of forming the first film, a reducing gas and at least one of an $AlCl_3$ gas and a TMA (trimethylaluminum) gas are supplied into the processing container to form an AlN film as the first film.

3. The method of claim 1, wherein in the act of forming the first film, a reducing gas and at least one of an $AlCl_3$ gas and a TMA (trimethylaluminum) gas are alternately supplied into the processing container with supply of a purge gas interposed therebetween form an AlN film as the first film.

4. The method of claim 1, wherein in the act of forming the first film, a pressure inside the processing container is 0.1 to 10 Torr.

5. The method of claim 1, wherein the first film has a thickness of 1 to 2 nm.

6. The method of claim 1, further comprising:
   after forming the first film and before forming the tungsten film, supplying a $WF_6$ gas and a $SiH_4$ gas into the processing container to form an initial tungsten film for generating tungsten nuclei on the surface of the substrate.

7. The method of claim 1, further comprising:
   after forming the first film and before forming the tungsten film, supplying a $SiH_4$ gas into the processing container to treat the surface of the substrate.

8. The method of claim 1, wherein the act of forming the first film and the act of forming the tungsten film are performed without breaking vacuum.

9. The method of claim 2, wherein the reducing gas is an $NH_3$ gas.

10. The method of claim 3, wherein the reducing gas is an $NH_3$ gas.

11. The method of claim 6, wherein in the act of forming the initial tungsten film, the $WF_6$ gas and the $SiH_4$ gas are alternately supplied into the processing container with supply of a purge gas interposed therebetween.

12. The method of claim 6, wherein in the act of forming the initial tungsten film a pressure inside the processing container is 1 to 100 Torr.

13. The method of claim 6, wherein the initial tungsten film has a thickness of 0.5 to 5 nm.

14. A film forming system, comprising:
   a first film forming apparatus including a first processing container, a first exhaust part,
   a first heating mechanism and a first gas supply mechanism including an aluminum-containing gas supply source;
   a second film forming apparatus including a second processing container, a second exhaust part, a second heating mechanism and a second gas supply mechanism including a tungsten gas supply source; and
   a control part,
   wherein the control part is configured to control the first exhaust part, the first heating mechanism, the first gas supply mechanism, the second exhaust part, the second heating mechanism and the second gas supply mechanism so as to perform: forming a first film of an aluminum-containing material on a surface of a substrate having a TiN film formed thereon in the first processing container while heating the substrate in a reduced pressure atmosphere; and forming a tungsten film on the first film in the second processing container while heating the substrate having the first film formed thereon in a reduced pressure atmosphere.

15. The system of claim 14, wherein the first gas supply mechanism further includes an aluminum-containing gas supply source configured to supply at least one of an $AlCl_3$ gas and a TMA (trimethylaluminum) gas into the first processing container and a reducing gas supply source configured to supply a reducing gas into the first processing container, and
   the control part controls the first gas supply mechanism so as to supply at least one of the $AlCl_3$ gas and the TMA gas and the reducing gas into the first processing container to form an AlN film as the first film.

16. The system of claim 14, wherein the first gas supply mechanism further includes an aluminum-containing gas supply source configured to supply at least one of an $AlCl_3$ gas and a TMA (trimethylaluminum) gas into the first processing container, a reducing gas supply source configured to supply a reducing gas into the first processing container and a purge gas supply source configured to supply a purge gas into the first processing container, and the control part controls the first gas supply media so as to alternately supply at least one of the AlCl$_3$ gas and the TMA gas and the reducing gas into the first processing container with the supply of the purge gas interposed therebetween to form an AlN film as the first film.

17. The system of claim 14, wherein the control part controls the first exhaust part so that a pressure inside the first processing container becomes 0.1 to 10 Torr in the act of forming the first film.

18. The system of claim 14, wherein the control part controls the first exhaust part, the first heating mechanism and the first gas supply mechanism so that the first film has a film thickness of 1 to 2 nm.

19. The system of claim 14, wherein the second gas supply mechanism further includes a WF$_6$ gas supply source configured to supply a WF$_6$ gas into the second processing container and a SiH$_4$ gas supply source configured to supply a SiH$_4$ gas into the second processing container, and the control part controls the second gas supply mechanism so as to, before the act of forming the tungsten film, supply the WF$_6$ gas and the SiH$_4$ gas into the second processing container to form an initial tungsten film for generating tungsten nuclei on the surface of the substrate.

20. The system of claim 14, wherein the second gas supply mechanism includes a gas supply source configured to supply a SiH$_4$ gas into the second processing container, and the control part controls the second gas supply mechanism so as to, before the act of forming the tungsten film, supply the SiH$_4$ gas into the second processing container to treat the surface of the substrate.

21. The system of claim 14, further comprising:

a vacuum transfer chamber to which the first film forming apparatus and the second film forming apparatus are connected, and a transfer mechanism configured to transfer the substrate between the first film forming apparatus, the second film forming apparatus and the vacuum transfer chamber, wherein the control part controls the transfer mechanism, the first exhaust part and the second exhaust part so that the act of forming the first film and the act of forming the tungsten film are performed without breaking vacuum.

22. The system of claim 15, wherein the reducing gas is an NH$_3$ gas.

23. The system of claim 16, wherein the reducing gas is an NH$_3$ gas.

24. The system of claim 19, wherein the second gas supply mechanism further includes a purge gas supply source configured to supply a purge gas into the second processing container, and the control part controls the second gas supply mechanism so as to, in the act of forming the initial tungsten film, alternately supply the WF$_6$ gas and the SiH$_4$ gas into the second processing container with the supply of the purge gas interposed therebetween.

25. The system of claim 19, wherein the control part controls the second exhaust part so that a pressure inside the second processing container becomes 1 to 100 Torr in the act of forming the initial tungsten film.

26. The system of claim 19, wherein the control part controls the second exhaust part, the second heating mechanism and the second gas supply mechanism so that the initial tungsten film has a film thickness of 0.5 to 5 nm.

27. A film forming apparatus, comprising:

a processing container;

an exhaust part;

a heating mechanism;

a gas supply mechanism including an aluminum-containing gas supply source and a tungsten-containing gas supply source; and a control part, wherein the control part is configured to control the exhaust part, the heating mechanism and the gas supply mechanism so as to perform: forming a first film of an aluminum-containing material on a surface of a substrate having a TiN film formed thereon in the processing container while heating the substrate in a reduced pressure atmosphere; and forming a tungsten film on the first film in the processing container while heating the substrate having the first film formed thereon in a reduced pressure atmosphere.

28. The apparatus of claim 27, wherein the gas supply mechanism further includes an aluminum-containing gas supply source configured to supply at least one of an AlCl$_3$ gas and a TMA (trimethylaluminum) gas into the processing container and a reducing gas supply source configured to supply a reducing gas into the processing container, and the control part controls the gas supply mechanism so as to supply at least one of the AlCl$_3$ gas and the TMA gas and the reducing gas into the processing container to form an AlN film as the first film.

29. The apparatus of claim 27, wherein the gas supply mechanism further includes an aluminum-containing gas supply source configured to supply at least one of an AlCl$_3$ gas and a TMA (trimethylaluminum) gas into the processing container, a reducing gas supply source configured to supply a reducing gas into the processing container and a purge gas supply source configured to supply a purge gas into the processing container, and the control part controls the gas supply mechanism so as to alternately supply at least one of the AlCl$_3$ gas and the TMA gas and the reducing gas into the processing container with the supply of the purge gas interposed therebetween to form an AlN film as the first film.

30. The apparatus of claim 27, wherein the control part controls the exhaust part so that a pressure inside the processing container becomes 0.1 to 10 Torr in the act of forming the first film.

31. The apparatus of claim 27, wherein the control part controls the exhaust part, the heating mechanism and the gas supply mechanism so that the first film has a film thickness of 1 to 2 nm.

32. The apparatus of claim 27, wherein the gas supply mechanism further includes a WF$_6$, gas supply source configured to supply a WF$_6$ gas into the processing container and a SiH$_4$ gas supply source configured to supply a SiH$_4$ gas into the processing container, and the control part controls the gas supply mechanism so as to, after the act of forming the first film and before the act of forming the tungsten film, supply the WF$_6$ gas and the SiH$_4$ gas into the processing container to form an initial tungsten film for generating tungsten nuclei on the surface of the substrate.

33. The apparatus of claim 27, wherein the gas supply mechanism further includes a $SiH_4$ gas supply source configured to supply a $SiH_4$ gas into the processing container, and the control part controls the gas supply mechanism so as to, before the act of forming the tungsten film, supply the $SiH_4$ gas into the processing container treat the surface of the substrate.

34. The apparatus of claim 27, wherein the control part controls the exhaust part so that the act of forming the first film and the act of forming the tungsten film are performed without breaking vacuum.

35. The apparatus of claim 28, wherein the reducing gas is an $NH_3$ gas.

36. The apparatus of claim 29, wherein the reducing gas is an $NH_3$ gas.

37. The apparatus of claim 32, wherein the gas supply mechanism further includes a purge gas supply source configured to supply a purge gas into the processing container, and the control part controls the gas supply mechanism so as to, in the act of forming the initial tungsten film, alternately supply the $WF_6$ gas and the $SiH_4$ gas into the processing container with the supply of the purge gas interposed therebetween.

38. The apparatus of claim 32, wherein the control part controls the exhaust part so that a pressure inside the processing container becomes 1 to 100 Torr in the act of forming the initial tungsten film.

39. The apparatus of claim 32, wherein the control part controls the exhaust part, the heating mechanism and the gas supply mechanism so that the initial tungsten film has a film thickness of 0.5 to 5 nm.

\* \* \* \* \*